United States Patent [19]

Mori

[11] Patent Number: 5,071,782

[45] Date of Patent: Dec. 10, 1991

[54] VERTICAL MEMORY CELL ARRAY AND METHOD OF FABRICATION

[75] Inventor: Kiyoshi Mori, Stafford

[73] Assignee: Texas Instruments Incorporated, Dallas, Tex.

[21] Appl. No.: 546,490

[22] Filed: Jun. 28, 1990

[51] Int. Cl.⁵ ........................................ H01L 21/265
[52] U.S. Cl. ...................... 437/48; 437/43; 437/52; 437/59; 437/203; 357/23.4; 357/23.5
[58] Field of Search ............ 437/48, 43, 52, 59, 437/203; 357/23.4, 23.5; 365/185

[56] References Cited

U.S. PATENT DOCUMENTS

| | | | |
|---|---|---|---|
| 3,975,221 | 8/1976 | Rodgers | 148/DIG. 53 |
| 4,169,291 | 9/1979 | Rossler | 357/23.5 |
| 4,222,062 | 9/1980 | Trotter et al. | 148/DIG. 168 |
| 4,975,383 | 12/1990 | Baglee | 437/52 |
| 4,987,090 | 1/1991 | Hsu | 437/52 |

FOREIGN PATENT DOCUMENTS 56-29362  3/1981  Japan .................................. 357/23.4

Primary Examiner—Brian E. Hearn
Assistant Examiner—Kevin Picardat
Attorney, Agent, or Firm—Ronald O. Neerings; N. Rhys Merrett; Melvin Sharp

[57] ABSTRACT

A vertical memory cell EPROM array (FIGS. 1, 1a and 1b) uses a vertical floating gate memory cell structure that can be fabricated with reduced cell area and channel length. The vertical memory cell memory array includes multiple rows of buried layers that are vertically stacked—a drain bitline (34) over a source groundline (32), defining a channel layer (36) in between. In each bitline row, trenches (22) of a selected configuration are formed, extending through the drain bitline and channel layer, and at least partially into the source groundline, thereby defining corresponding source (23), drain (24) and channel regions (25) adjacent each trench. The array can be made contactless (FIG. 1a), half-contact (FIG. 2a) or full contact (FIG. 2b), trading decreased access time for increased cell area.

11 Claims, 3 Drawing Sheets

VERTICAL MEMORY CELL ARRAY AND METHOD OF FABRICATION

TECHNICAL FIELD OF THE INVENTION

The invention relates generally to memory cell arrays, and more particularly relates to an EPROM array of vertical floating gate memory cells, and a method of fabricating such an array.

Related Patent

This patent incorporates by reference the subject matter of co-pending U.S. Pat. application Ser. No. 07/448,135, entitled "Vertical Floating-Gate Transistor", filed Dec. 8, 1989, which is a continuation of U.S. Pat. application No. 07/181,789, filed Apr. 15, 1988, now abandoned, which is a assigned to Texas Instruments Inc., the assignee of this application.

BACKGROUND OF THE INVENTION

Memory cells in memories or logic arrays typically use FET transistors with a floating gate structure. The bit state of a cell depends upon the charge on the insulated floating gate, with the voltage needed to charge the floating gate depending upon the coupling coeficient between a program gate and the underlying floating gate.

The specific problem to which the invention can be applied is the fabrication of an EPROM using an array of vertical floating gate transistor memory cells. A vertical floating gate transistor is described in the related patent—the vertical floating gate structure permits transistors, such as used in memory cells, to be fabricated with less cell area than achievable with current planar technology.

EPROM memories commonly use floating-gate, avalanche-injection, metal-oxide-semiconductor (FAMOS) transistors. To program the EPROM, which are typically N-channel devices, a positive program voltage of a sufficient magnitude is applied to the program gate to cause channel hot electrons to be transferred from the channel region to the floating gate. This program charge may be erased using UV light or other radiation.

To achieve greater bit densities for EPROM chips, memory cell area has been gradually reduced. Conventionally, the floating gate FET transistors used for memory cells have been fabricated in a planar structure, i.e., with a planar source/channel/drain structure at the substrate surface, including a planar floating gate. For a given memory cell size, the chip area assigned to the cell can be minimized by making the array contactless, albeit at the expense of access time—electrical contacts to the program (or control) gate and drain regions for each FET cell are made only at the ends of respective surface wordline columns (forming the program gates) and buried bitline rows (forming the drain regions), thereby avoiding the need for individual contacts (with associated contact areas) to each memory cell.

For planar FET structures in contactless arrays, cell size is largely dependent upon channel length. Channel length is determined by the width of the lines of photoresistive material used as an implant mask for implanting source and drain regions on either side of a photoresist line. Thus, reducing channel length to obtain smaller cell area necessitates improving photoresist masking procedures.

Using current planar fabrication technology, planar EPROM arrays with channel lengths of about one micron are conventional, and channel lengths down to about 0.6 microns are becoming available (albeit at a significantly higher level of capital investment in sub-micron patterning equipment). In addition to reducing cell size, reducing channel length increases channel current for a given read voltage, thereby decreasing access time.

The vertical floating gate structure described in the related patent offers a fabrication technology that allows memory cell area to be significantly reduced from that obtainable with current planar fabrication technology. In addition, channel lengths can readily be reduced to below 0.5 microns, with an attendant decrease in access time.

As described in the related patent, the vertical gate structure is fabricated into a trench surrounded by buried, vertically-stacked source and drain regions separated by a channel region with a predetermined channel length (in the vertical dimension). See Section 1 of the Detailed Description and FIG. 1a.

Accordingly, a need exists for an array structure using vertical floating gate transistor cells, such as for an EPROM, and a method of fabricating such an array.

SUMMARY OF THE INVENTION

The invention is a vertical memory cell array using a vertical floating gate memory cell structure that can be fabricated with reduced cell area and channel length. An exemplary application of such an array is an EPROM.

In one aspect of the array structure of the invention, the vertical-cell memory array is formed in a substrate of a first conductivity type (such as P), and includes multiple rows of buried layers that are vertically stacked—a drain bitline and a source groundline extending under the drain bitline, defining a channel layer in between. The drain bitlines and source groundlines are of a second conductivity type (such as N+), while the channel layers are of the first conductivity type.

For each row, multiple trench areas of a selected configuration are formed in the substrate, each trench extending through the drain bitline and channel layer, and at least partially into the source groundline, thereby defining corresponding source, drain and channel regions adjacent each trench.

For each trench, a floating gate conductor is insulatively disposed vertically into the trench. In particular, a vertical floating gate is insulatively disposed over the channel region adjacent the associated trench.

Multiple columns of conductive layers form program gate wordlines that are disposed over respective columns of trenches. At each trench, a program gate portion of the corresponding wordline is insulatively disposed over the floating gate.

In one aspect of the method of fabricating the array, the buried source groundline, drain bitline and channel layer are formed in successive doping steps: first forming multiple rows of doped source areas of the second conductivity type, extending to a groundline depth corresponding to a selected groundline depth for the source groundline; then forming multiple rows of doped channel areas of the first conductivity type into respective ones of the source areas, extending to a depth corresponding to a selected source/channel junction depth, thereby defining a source groundline between the groundline depth and the source/channel junction depth; and finally forming multiple rows of doped drain areas of the second conductivity type into respective ones of the channel areas, extending to a selected drain/channel junction depth, thereby defining a channel layer between the drain/channel junction and the source/channel junction, and defining the drain bitline extending between the substrate surface and the drain/channel junction.

After forming the source groundlines and drain bitlines, columns of vertical transistor trenches are formed into those areas. Then, the floating gates are formed into each trench, over a gate insulator layer. The transistors are completed by forming columns of wordline conductors over columns of trenches, insulated from the floating gates by an interlevel insulator.

In more specific aspects of the invention, the vertical floating gate is disposed around the walls of the trench, defining a central cavity that extends into the trench. The program gate conductor is disposed into the cavity, thereby increasing the coefficient of capacitive coupling (and reducing the voltage required to charge the floating gate).

In a contactless array embodiment, the rows of source groundlines and channel layers are formed such that, at least at one end of each row, these regions extend to the surface of the substrate, providing a source contact area for making an electrical contact to the source groundline. Electrical contacts are also formed at respective ends of the drain bitline and program wordline.

Alternatively, either a half-contact or full-contact embodiment of the array will provide increased access time, at the expense of increasing cell area to accommodate the contact lines. For the half-contact embodiment, the drain bitline is widened on one side of the trenches, providing a drain contact area between rows (which thereby extends the distance between rows). For the full-contact embodiment, in addition to extending the drain bitline, the source groundline is extended up to the substrate surface beyond (electrically isolated from) the drain contact area to provide a source contact area.

The technical advantages of the invention include the following. The array uses a vertical floating gate transistor structure, enabling cell area and channel length to be reduced. The array can be made contactless, further reducing memory cell area. Alternative half- or full-contact embodiments provide decreased access time at the expense of increased cell area (although, still reduced from planar transistor arrays of a comparable configuration). The fabrication method uses conventional memory fabrication techniques, and in particular, does not require the use of expensive sub-micron planar fabrication technologies.

BRIEF DESCRIPTION OF THE DRAWINGS

For a more complete understanding of the invention, and for further features and advantages, reference is now made to the following Detailed Description of an exemplary embodiment of the invention, taken in conjunction with the accompanying Drawings, in which.

DETAILED DESCRIPTION OF THE INVENTION

The Detailed Description of an exemplary embodiment of the vertical-cell EPROM array of the invention is organized as follows:

1. Vertical-Cell Array
1.1. Vertical Floating Gate Structure
1.2. Contactless Array Structure
1.3. Half and Full Contact Array Structures
1.4. Operation
2. Method of Fabrication
2.1 Bitline Formation
2.2 Trench Formation
2.3 Gate Conductor Formation
3. Conclusion The exemplary embodiment is described in relation to an EPROM (erasable and programmable read only memory) array using the vertical floating gate structure described in the related application, which is incorporated by reference.

The Detailed Description of the vertical-cell array is in terms of N-channel FET devices, although the teachings of the invention apply equally to P-channel devices. The use of the source-drain terminology in connection with specific doped regions of a substrate is exemplary, and any such designations could be reversed. The FIGS. are illustrative, and are neither drawn to scale nor precisely lined.

Figure 1:
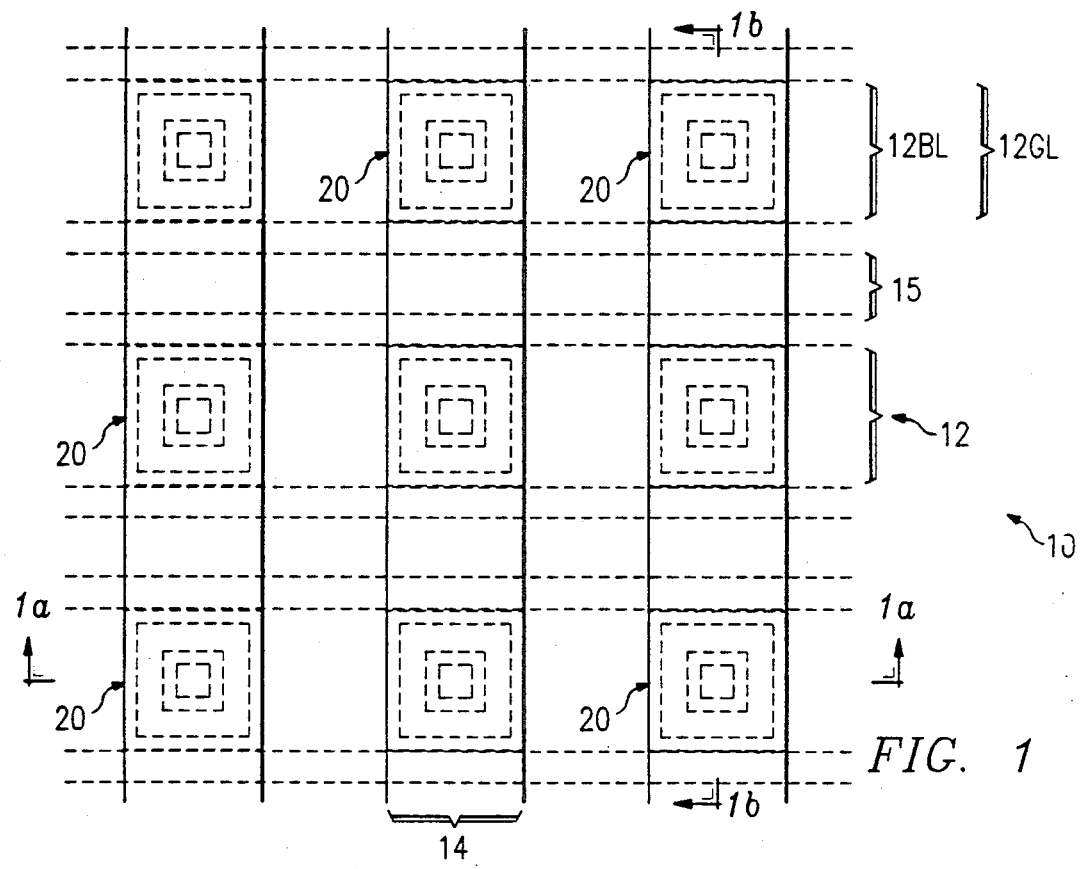
Fig. 1 is a plan view of the surface of a portion of an exemplary contactless EPROM array of vertical floating gate memory cells according to the invention.
Figure 1A:
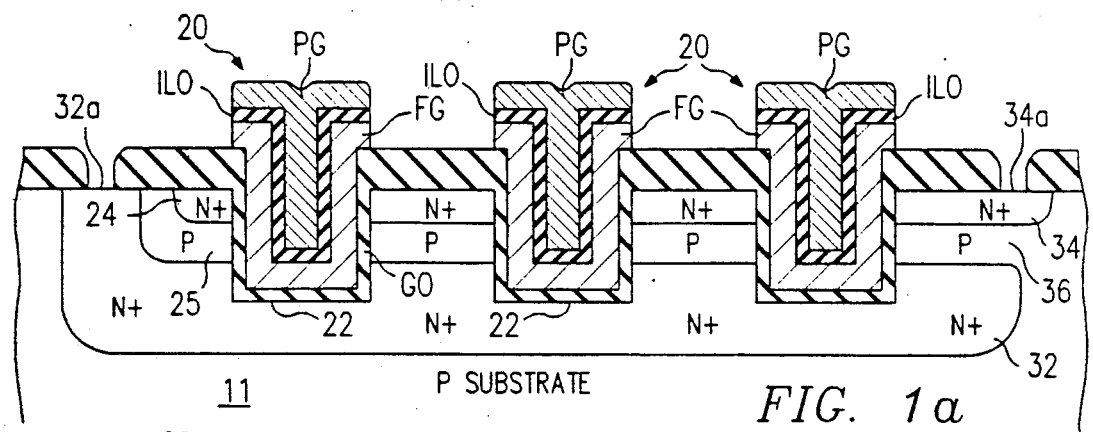
Figs. 1a and 1b are elevation cross section views respectively of a bitline row and a wordline column of the array in Fig. 1.
Figure 1B:
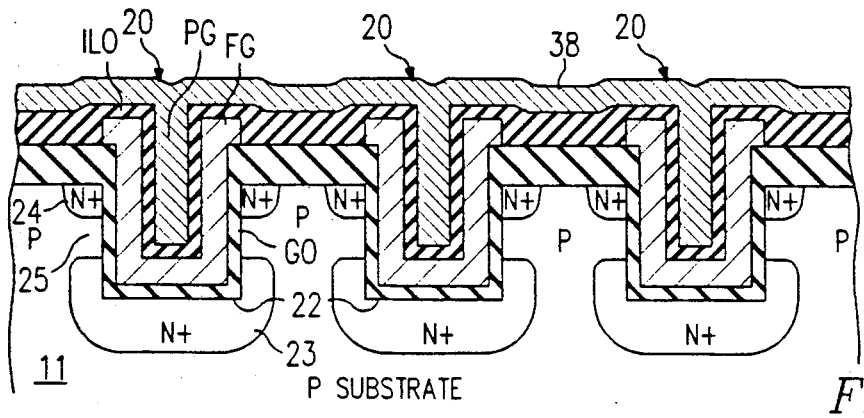

1. Vertical-Cell Array. FIGS. 1, 1a and 1b illustrate the structure of the exemplary vertical-cell EPROM contactless array of the invention. As described in Sections 1.2 and 1.3, the array may be made contactless or half-or full-contact, based on a design trade-off between reducing access time and minimizing cell size.

FIG. 1 is a plan view illustrating a 3×3 portion 10 of an array of vertical floating gate memory cells, fabricated on a substrate 11. The array comprises a grid of bitline rows 12 and wordline columns 14, with memory cells 20 being fabricated at the junctions. Each bitline row is separated by a row isolation area 15.

As described in Section 1.2, each bitline row 12 of the array is defined by buried vertically-stacked drain bitlines and source groundlines 12BL and 12GL that respectively form the source and drain regions for each cell transistor in that row, while each worline column 14 of the array forms the program gates for each cell transistor in that column.

1.1. Vertical Floating Gate Structure. FIGS. 1a and 1b are cross sectional views, respectively of a bitline row and a wordline column, that illustrate the basic structure of a vertical floating gate FET memory cell as used in the exemplary contactless array.

Referring to FIG. 1b, a vertical floating gate FET is fabricated in a trench 22 that, for the exemplary embodiment, is substantially square. Disposed in the trench are a vertically extending floating gate conductor FG and a vertically extending program gate conductor PG. Disposed around the lower portion of the trench is a buried N+ source region 23, and disposed around the upper portion of the trench (at the surface of substrate 11) is a buried N+ drain region 24. A vertically-extending channel region 25 of P-type material lies between the source and drain regions, with the configuration of the source and drain regions relative to the trench depth determining the channel length in the vertical dimension.

The vertical floating gate FG is disposed around the walls of trench 22, defining a central cavity 26. The floating gate is insulated from the trench walls, and a particular from channel region 25, by a gate (channel) oxide layer GO of a selected gate oxide thickness.

Program gate PG extends into cavity 26, and is insulated from vertical floating gate FG by an interlevel oxide layer ILO. Extending the program gate into the cavity defined by the floating gate maximizes overlap between the program gate and the floating gate, thereby maximizing the capacitive coupling coefficient and minimizing the program gate voltage required to charge the floating gate (for a given channel length).

1.2. Contactless Array Structure. The contactless vertical-cell array embodiment of the invention takes full advantage of the reduced cell size available with the vertical floating gate structure, at the expense of decreasing access time due to increased resistance attributable to reading through the elongate bitline. For example, where a full-contact planar-cell array might have a cell size of about 100 microns$^2$ with, the cell size of the contactless vertical-cell array might be 10 microns$^2$.

Referring to FIG. 1a, for the exemplary contactless EPROM array, each row of memory cells includes, in a vertically-stacked arrangement, a buried N+source groundline 32 (12GL in Fig. 1) and a buried N+drain bitline 34 (12BL in FIG. 1), separated by a buried channel layer 36. At one end of the row, the source groundline 32 extends to the surface of substrate 11, providing an electrical contact area 32a. At the other end of the row, the drain bitline 34 includes an electrical contact area 34a.

The source groundline and drain bitline respectively provide the source and drain regions for each of the cells in the row. That is, for each cell in the row, the trench extends through drain bitline 34 and channel layer 36, and partly into source groundline 32. Thus, for cell 20, the source and drain bitlines 32 and 34 provide the corresponding N+source region and N+drain region (23 and 24 in Fig. 1b).

Referring to Fig. 1b, the source and drain regions 23 and 24 are wider than the trenches for the memory cells. As a result, for each cell 20, the trench 22 is surrounded by the source region 23 and drain region 24, and therefore, by the channel region 25.

Each column includes a wordline 38 (14 in FIG. 1) that incorporates the program gates PG for each of the memory cells. Thus, at each cell, such as cell 20, the polysilicon that forms the wordline extends vertically into the trench cavity 26, overlapping the vertical floating gate FG. At one end of each wordline 38, an electrical contact area (not shown) is provided.

1.3. Half and Full Contact Structures. The half-and full-contact vertical-cell array embodiments of the invention provide reduced access times at the expense of increasing cell size attributable to adding chip area for contact lines, although still taking advantage of the reduction in cell size available with the vertical floating gate structure. For example, where the contactless vertical-cell array might have a cell size of about 10 microns$^2$, the cell size of the half-contact vertical-cell array might be 30 microns$^2$, while the cell size of the full-contact vertical-cell array might be 60 microns$^2$.

Figure 2A:
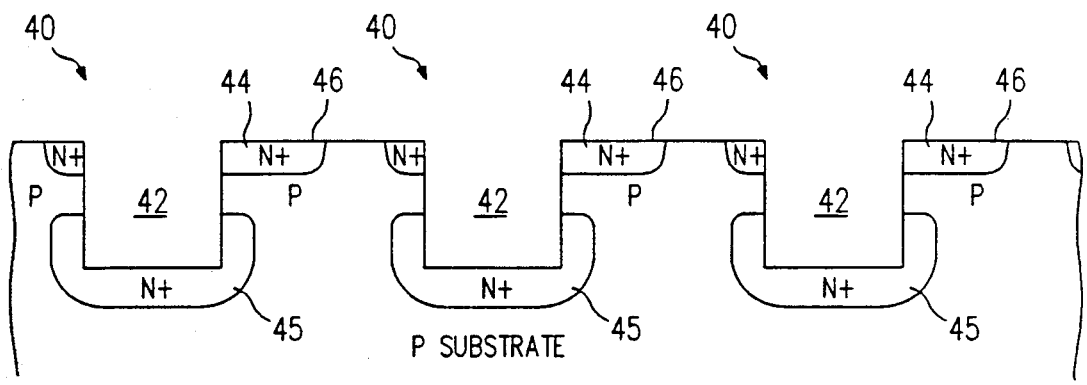
FIGS. 2a and 2b are elevation cross section views of a wordline column respectively illustrate the half-contact and full-contact configurations of the array.

FIG. 2a illustrates the half contact vertical-cell structure in a cross sectional elevation view of wordline column corresponding to the view in FIG. 1b (showing only the trenches and the source groundlines and drain bitlines). The vertical floating gate cell structure is essentially the same as for the contactless array, except that the drain bitline is extended to provide a drain contact area for each cell in the column.

That is, each memory cell 40 includes a trench 42 disposed through a drain bitline 44 into a source groundline 45. The drain bitline in extended along the substrate surface on one side, to provide a drain contact area 46.

After forming the vertical transistors, individual electrical contacts to the drain regions for each cell are formed conventionally. In general, a drain contact line (not shown) is formed over the drain contact area 46, along each bitline row, and drain contacts (not shown) are made between the drain contact line and the drain contact area 46.

Figure 2B:
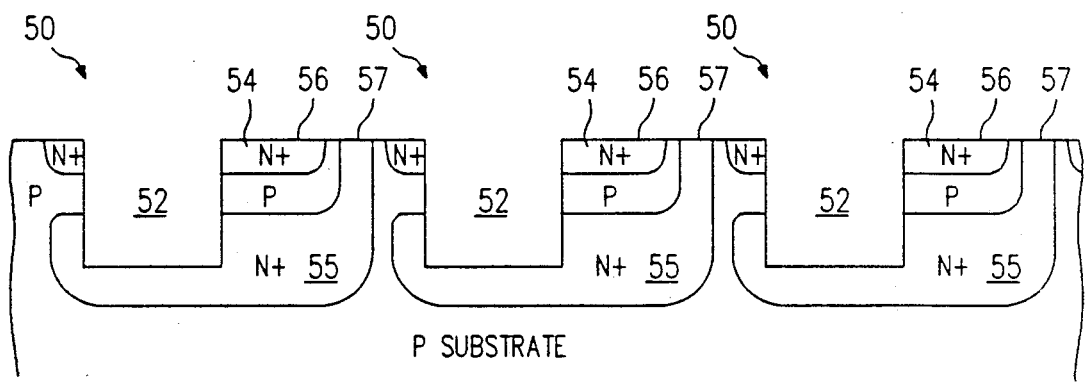

FIG. 2b illustrates the full contact vertical-cell structure in the same manner as FIG. 2a. Again, the vertical floating gate cell structure is essentially the same as in the contactless array, except that the drain bitline and the source groundline are both extended to provide respective contact areas for each cell in the column.

That is, each memory cell 50 includes a trench 52 disposed through a drain bitline 54 into a source groundline 55. The drain bitline it extended along the substrate surface on one side, to provide a drain contact area 56. The source groundline is extended, under the drain bitline, up to the substrate surface to provide a source contact area 57.

After forming the vertical transistors, individual electrical contacts to the drain and source regions for each cell are formed conventionally. In general, drain and source contact lines (not shown) are formed over the drain and source contact areas 56 and 57, along each bitline row, and drain and source contacts are made between respective contact lines and contact areas.

Figure 3:
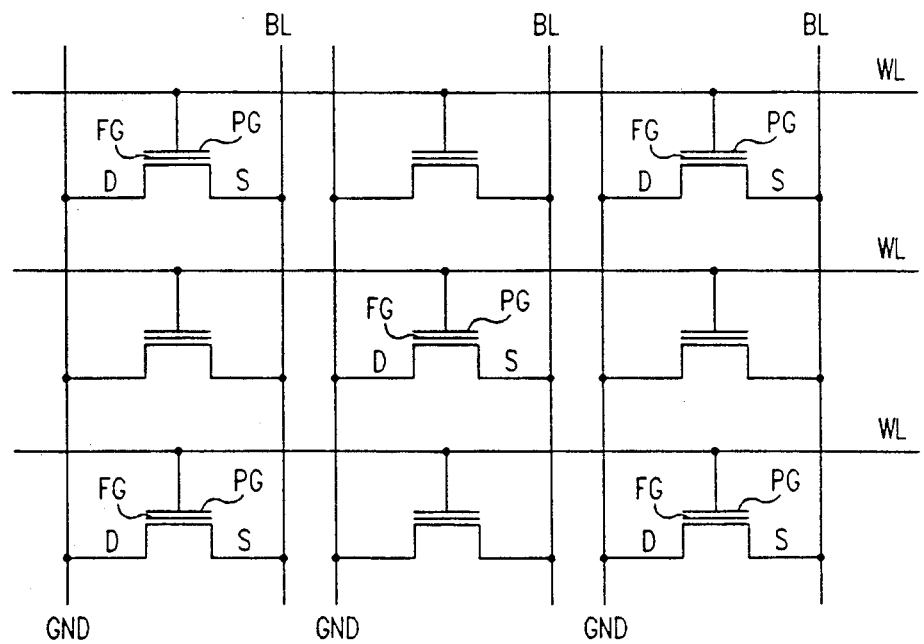
FIG. 3 illustrates the circuit configuration for the EPROM array.

1.4. Operation. FIG. 3 provides a circuit representation of a portion of the vertical-cell array.

Each FET cell includes a source S and a drain D, separated by a channel characterized by a channel length CL. An insulated floating gate FG is capacitively coupled between a program gate PG and the channel.

In each row of memory cells, the sources are coupled to a source groundline GND, while the drains are coupled to a drain bitline BL. In each column 24, the program gates are coupled to a wordline WL.

Programming (white/erase) and reading operations are accomplished conventionally by application of appropriate voltages on selected and deselected wordlines and source/drain groundlines/bitlines. For example, for an N-channel array, the source groundlines GND would typically be coupled to VG of ground, with programming and reading operations being accomplished by the application of appropriate positive voltages to the drain bitline and program gate wordline for the selected cell.

2. Method of Fabrication. The method of fabricating the exemplary vertical-cell EPROM array according to the invention will be described in connection with fabricating a contactless array in a substrate of P-type semiconductor. Conventional photolthographic techniques well known in the art are used—this description recuses on the major fabrication steps.

Fabricating half-contact or full-contact arrays is essentially identical, requiring only changes in patterning to form bitlines with contact areas, and the formation of source and/or drain contact lines.

Figure 4A:
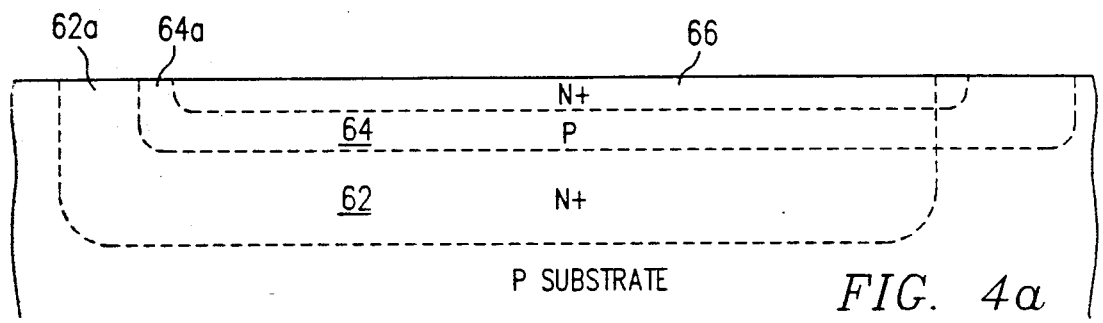
FIGS. 4a and 4b are elevation cross section views of the array at intermediate stages of fabrication, respectively prior to trench formation, and after floating gate definition.
Figure 4B:
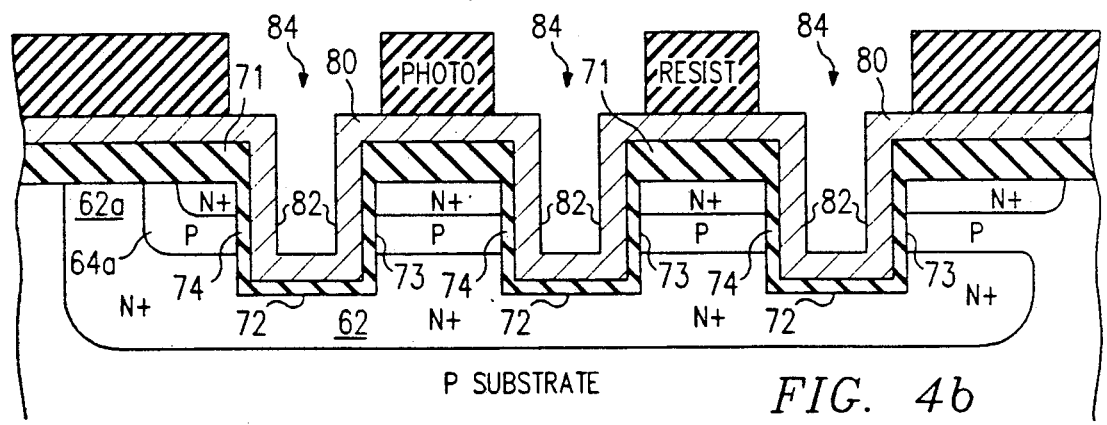
Figure 1:
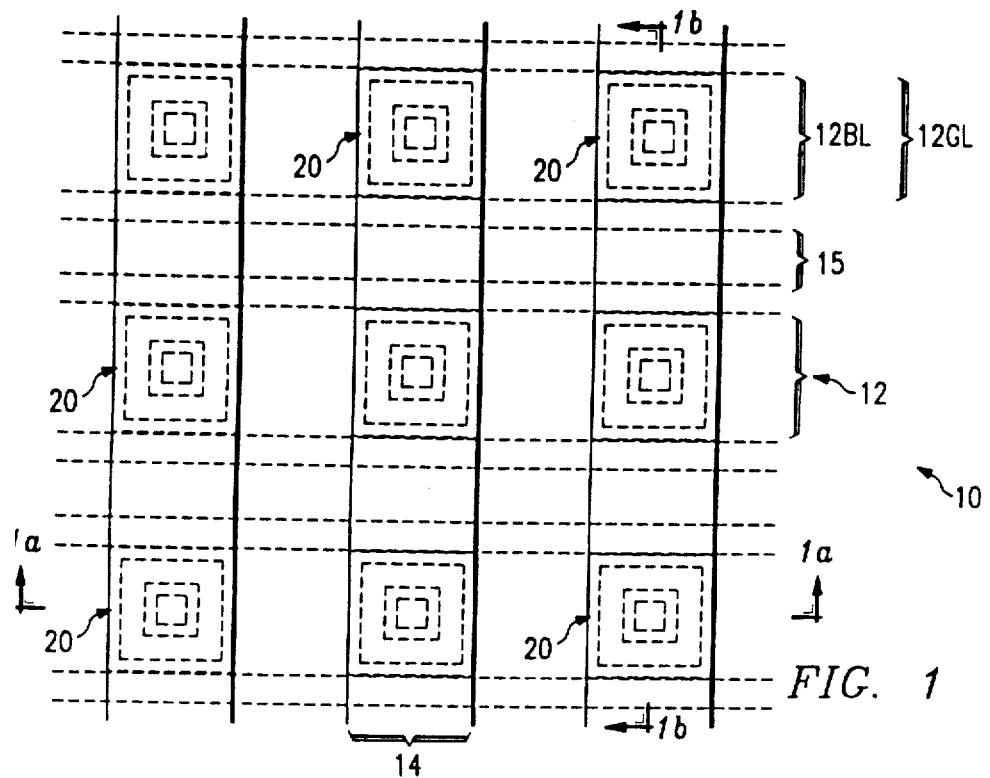
Figure 1A:
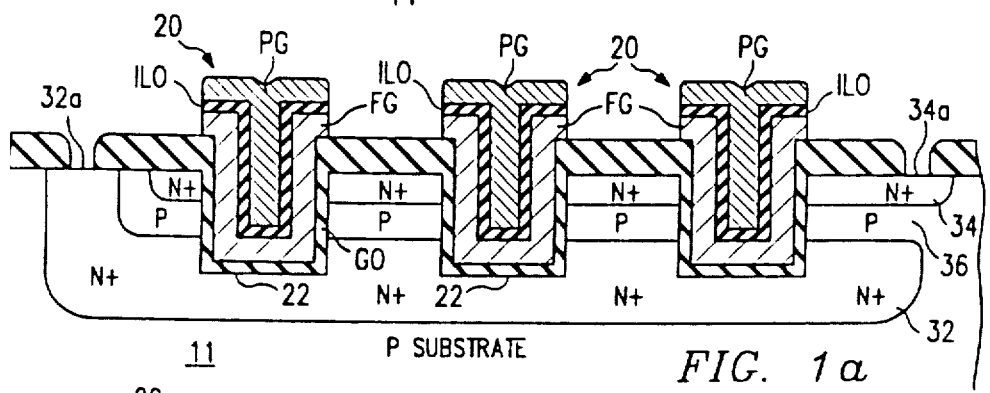
Figure 1B:
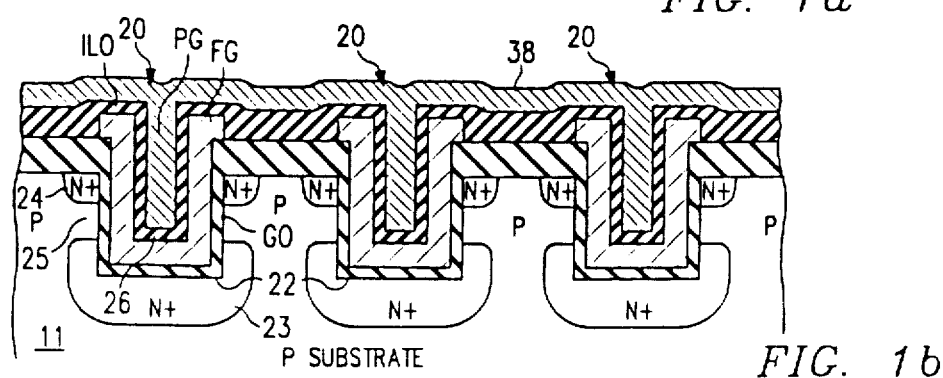
Figure 2A:
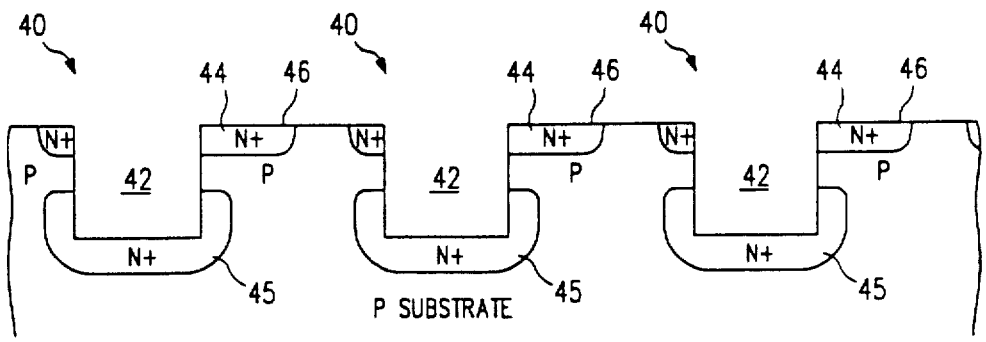
Figure 2B:
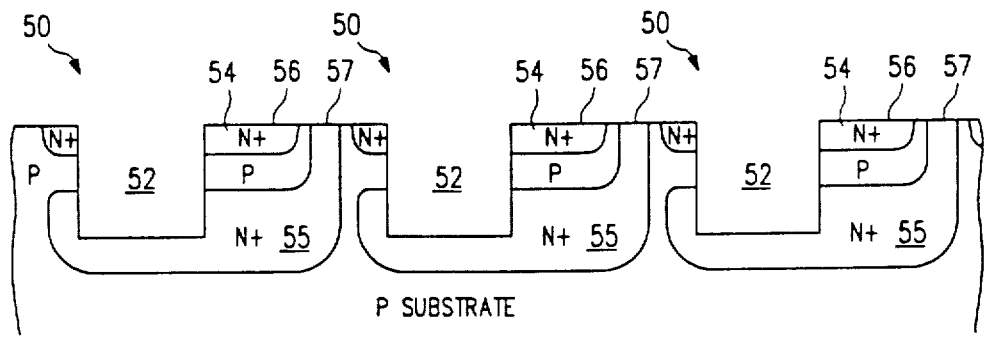
Figure 3:
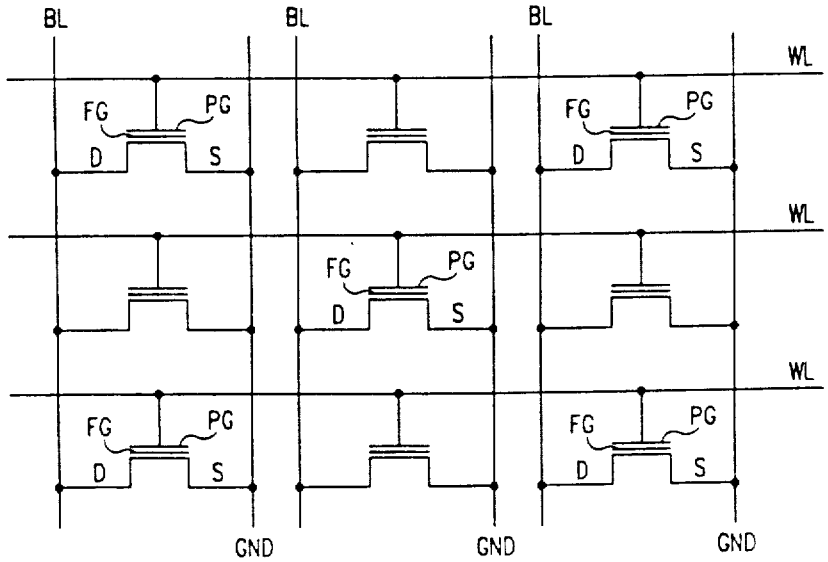

FIGS. 4a and 4b show the array at intermediate stages of fabrication. The starting material is a slice of P-type silicon of which only a portion is shown as substrate 11. A number of process steps would normally be performed to create transistors peripheral to the memory array, and these will not be described. For example, the EPROM memory device may be of the complementary field effect type (CMOS) having N-wells and P-wells formed in the substrate as part of a prior process to create peripheral transistors.

2.1. Bitline Formation. Referring to FIG. 4a, the first stage of fabrication involves forming rows of vertically-stacked source and drain bitlines and intervening channel layers. The steps for each row are identical, and the description of this stage will focus on a single exemplary row.

First, an N+implant/diffusion step using phosphorous forms an N+zone 62 that will form the source groundline (32 in Fig. 1a). Substrate 11 is patterned to expose a strip of substrate surface with a selected source groundline width, for example about 3 microns.

A phosphorous implant is performed (for example, at a dosage of about 4E11 ions/cm$^2$ and 40 KeV), followed by a thermal diffusion, to create the N+zone 62 (phosphorous is preferred over, for example, arsenic because of faster diffusion). Implant is followed by a thermal diffusion/annealing procedure, to provide thermal drive to a desired depth, and surface annealing. Final junction depth will depend upon subsequent thermal drive procedures, and corresponds to the desired depth of the source groundline bitline, for example 2.5—3.5 microns.

Next, the substrate is patterned to expose a strip over the N+zone 62 that is slightly wider than the N+zone and extends beyond it on one end, but leaves masked a surface area 62a on the other end. A P-type implant/diffusion step using boron forms a P-type zone 64 into the upper portion of the exposed N+zone 62.

This P-type zone will form the channel layer (36 in FIG. 1a), the depth of which establishes the source/channel junction between the channel layer and the source groundline (i.e., upper boundary of the first N+area 62), thereby defining the source groundline (32 in Fig. 1a). The source groundline is isolated under the P-type zone, except for the extension to the surface area 62a that will form a contact area for the groundline (see, FIG. 1a).

The boron implant is performed (for example, at a dosage of about 1E13 ions/cm$^2$ and 50 KeV), followed by a thermal diffusion, to create the P-type substrate region. Implant is followed by a thermal diffusion/annealing procedure, to provide thermal drive to a desired depth, and surface annealing. Again, final junction depth will depend upon subsequent thermal drive procedures, and corresponds to the desired depth of the source/channel junction between the source groundline and the channel layer, for example 1.5-2.0 microns.

In the final step of the implant stage, the substrate is patterned to expose a strip over the P-type zone 64 that is slightly wider than the N+zone 62 under the P-type zone (see, FIG. 1a), and leaves masked at one end a P-type surface area 64a (as well as the N+surface area 62a). An N+implant/diffusion step using arsenic forms a drain bitline 66 into the upper portion of the exposed P-type zone 64.

This N+drain bitline establishes the drain/channel junction between the P-type zone 64 and the drain bitline, thereby defining the channel layer (36 in FIG. 1a) characterized by a predetermined channel length in the vertical dimension (for example, 0.5 microns). The channel layer is isolated under the drain bitline, except for the extension to the surface area 64a that isolates the drain bitline from the upward extension of the source groundline to surface area 62a.

An arsenic implant is performed (at a dosage of about 8E15 ions/cm$^2$ and 150 KeV), followed by a thermal diffusion, to create the second N+region (arsenic is preferred over phosphorous because of slower, more controlled diffusion). Implant is followed by a thermal diffusion/annealing procedure, to provide thermal drive to a desired depth, and surface annealing. This final thermal drive procedure produces the final source/channel and drain/channel junctions. The drain bitline extends down to a depth that corresponds to the desired drain/channel junction, for example 1.0-1.5 microns.

2.2 Trench Formation. The second stage of fabrication involves formation, in each row, of the trenches into which will be formed the vertical floating gate FET memory cells.

Referring to FIG. 4b, on a thick oxide layer 71 is grown over the substrate surface, to a thickness of several thousand Angstroms.

The surface of the thick oxide is then patterned to expose along each bitline row trench areas of a selected configuration, size and spacing, thereby establishing memory cell area. For the exemplary embodiment, the trench cross sectional configuration is substantially square, with each side being about 2 microns.

Generally, the configuration and size of the trench, and therefore of the memory cell, is not critical to the invention, subject to the trench area and depth constraints imposed by the configuration of the source and drain bitlines, as described in this Section. In particular, the trench sidewalls need not be vertical, but vertical sidewall construction is more surface-area efficient and provides the shortest channel length transistor.

After patterning, a conventional trench etch procedure is used to define trenches 72 with substantially straight sidewalls 73, extending down to a selected trench depth, for example 2 microns. The etch is controlled such that the trench extends down through the drain bitline 66 and the channel layer 64, and into the source groundline 62 (see, FIG. 1b).

Trench cross sectional area and the widths of the source and drain bitlines must be cooperatively chosen to ensure that, after trench formation, both the source and drain bitlines provide a continuous conductive path along a respective row. Thus, the trench cross sectional area must be such that the drain bitline completely surrounds each trench, which is accomplished in the exemplary embodiment by making the trench width less than the drain bitline width (see, FIG. 1b).

For the source groundline, because in the exemplary configuration the trenches do not extend through the bitline, a continuous conductive path is provided along the bitline under the trenches, so that the source groundline is not required to surround the trench. However, for the exemplary embodiment, the width of the source groundline is such that it does surround the trench, and indeed, that width is slightly greater than the width of the drain bitline (see, Fig. 1b).

This configuration provides continuous source regions and drain regions around each trench. As a result, the channel region is also continuous around each trench, thereby maximizing the channel interface to the floating gate, and optimizing charging efficiency.

2.3. Gate Conductor Formation. The third stage of fabrication involves forming the vertical floating gate and program gate conductors, and associated insulating layers.

Referring to FIG. 4b, after trench formation, an gate oxide layer 74 is grown over the sidewalls and bottom of each trench 72, to a thickness of about 200 Angstroms. During this procedure, some small amount of oxide will also be grown onto the thick oxide.

Next, a first polysilicon layer 80, which will form the floating gates for the memory cells, is deposited over the oxide layer 71, and into each trench. This poly 1 layer is deposited to a thickness of about 3000–5000 Angstroms, and highly doped N+ with phosphorous to render it conductive.

The poly 1 deposition forms a conductive layer within each trench, including a vertically extending section 82. The vertically extending section 82 overs the gate oxide 74 on the sidewalls of the trench, leaving a central cavity 84 in the trench.

The poly 1 layer is then patterned and etched to define the floating gates.

Referring to FIGS. 1, 1a and 1b after definition of the vertical floating gates FG, the text step is to grow over the substrate an interlevel oxide layer ILO. This interlevel oxide layer grows over the poly of the floating gates to a thickness of about 300 Angstroms. Alternatively, an oxide/nitride/oxide layer of equivalent oxide (electrical) thickness may be used.

Next, a second polysilicon layer which will form the program gates PG for the memory cells, is deposited over the substrate and into each trench cavity (84 in FIG. 4b). The poly 2 fills the trench cavity, and is insulated from the floating gate conductors FG by the interlevel oxide ILO. This poly 2 layer is deposited to a thickness of about 3000–5000 Angstroms, and highly doped N+ with phosphorous to render it conductive.

The poly 2 deposition forms a vertically extending conductive program gate element PG within each trench. The vertically extending program gate overlaps the vertically extending portion of the floating gate, providing capacitive coupling between the program gate and the insulated floating gate.

The poly 2 layer 20 is then patterned and etched to define the wordlines WL (see, FIG. 1b), which incorporate the program gates PG.

3. Conclusion. Although the invention has been described with respect to exemplary embodiments, various changes and modifications of the disclosed embodiments, as well as alternative embodiments, will be suggested to one skilled in the art. It is, therefore, intended that the invention encompass such changes and modifications as fall within the scope of the appended claims.

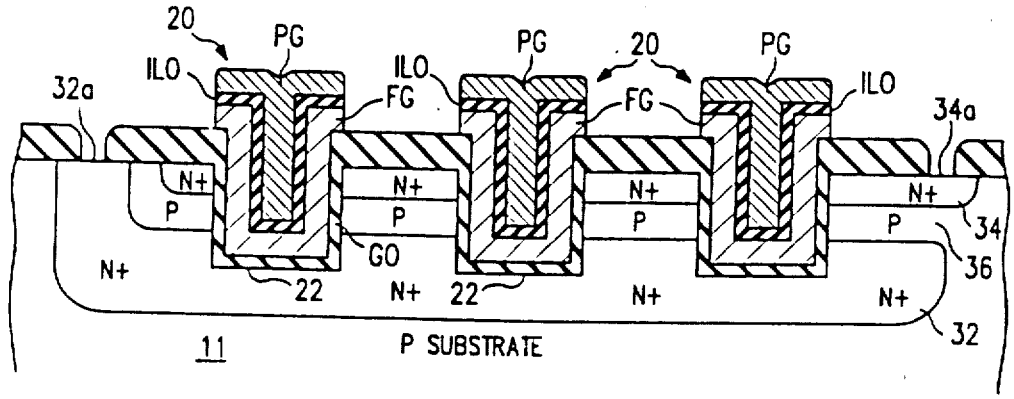

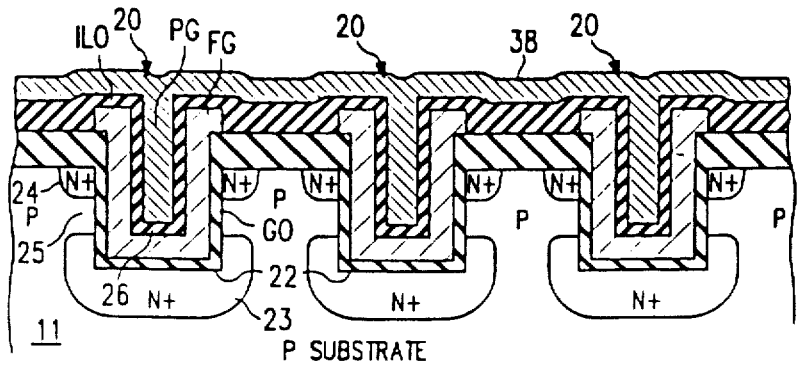

What is claimed is:

1. A method of fabricating a vertical memory cell array, using vertical floating gate FET memory cells, in a substrate of a first conductivity type, comprising the steps:

forming in the substrate multiple rows of doped groundline zones of a second conductivity type extending down to a selected groundline depth;

into each groundline zone, forming a doped channel zone of the first conductivity type extending down to a selected source/channel junction depth, thereby defining a buried source groundline between the source/channel junction and the groundline depth;

into each channel zone, forming a doped drain bitline of the second conductivity type extending down to a selected drain/channel junction depth, thereby defining a buried channel layer between the drain/channel junction and the source/channel junction;

in each bitline row, forming multiple trench areas through said drain bitline, said channel layer and at least partially into said source groundline, thereby defining drain, source and channel regions adjacent each trench, each trench further having substantially vertical sidewalls;

for each trench, forming a gate insulator layer over the substantially vertical sidewalls of said trench;

for each trench, forming a floating gate conductor disposed into the trench, insulated from the associated channel region by the gate insulator;

forming an interlevel insulator layer over said floating gate conductor; and forming onto the substrate multiple columns of program gate worline conductors extending over respective columns of trenches, insulated from said floating gates by said interlevel insulator.

2. The method of fabricating a vertical memory cell array of claim 1, wherein, for each trench, said floating gate is formed over the sidewalls of such trench defining, a central cavity, and the program gate conductor is disposed into such cavity.

3. The method of fabricating a vertical memory cell array of claim 2, wherein the trench is substantially square in horizontal cross section and has substantially vertical sidewalls.

4. The method of fabricating a vertical memory cell array of claim 1, wherein the trench is surrounded by the source groundline and drain bitline.

5. The method of fabricating a vertical memory cell array of claim 1, wherein said source groundline and drain bitline are doped N+.

6. The method of fabricating a vertical memory cell array of claim 1, wherein the memory array is an EPROM.

7. The method of fabricating a vertical memory cell array of claim 1, wherein said drain bitline, channel zone and groundline zone are formed by respective implant/diffusion procedures.

8. A method of fabricating a vertical memory cell array, using vertical floating gate FET memory cells, in a substrate of a first conductivity type, comprising the steps:

forming in the substrate multiple rows of doped groundline zones of a second conductivity type extending down to a selected groundline depth;

into each groundline zone, forming a doped channel zone of the first conductivity type extending down to a selected source/channel junction depth, thereby defining a buried source groundline between the source/channel junction and the groundline depth;

into each channel zone, forming a doped drain bitline of the second conductivity type extending down to a selected drain/channel junction depth, thereby defining a buried channel layer between the drain/channel junction and the source/channel junction;

in each bitline row, forming multiple trench areas a through said drain bitline, said channel layer and at least partially into said source groundline, thereby defining drain, source and channel regions adjacent each trench;

for each drain bitline, forming a drain contact area at one end of the corresponding row, such that a single electrical contact to all drain regions is made through said drain bitline and said drain contact area;

for each source groundline, forming a source contact area at one end of the corresponding row, such that a single electrical contact to all source regions is made through said source groundline and said source contact area;

for each trench, forming a gate insulator layer over the walls of such trench;

for each trench, forming a floating gate conductor disposed into the trench, insulated from the associated channel region by the gate insulator;

forming an interlevel insulator layer over said floating gate conductor; and forming onto the substrate multiple columns of program gate worline conductors extending over respective columns of trenches, insulated from said floating gates by said interlevel insulator.

9. The method of fabricating a vertical memory cell array of claim 8, wherein each source groundline extends tot he surface at one end beyond the corresponding end of the drain bitline to form said source contact area.

10. A method of fabricating a vertical memory cell array, using vertical floating gate FET memory cells, in a substrate of a first conductivity type, comprising the steps:

forming in the substrate multiple rows of doped groundline zones of a second conductivity type extending down to a selected groundline depth;

into each groundline zone, forming a doped channel zone of the first conductivity type extending down to a selected source/channel junction, depth, thereby defining a buried source groundline between the source/channel junction and the groundline depth;

into each channel zone, forming a doped drain bitline of the second conductivity type extending down to a selected drain/channel junction depth, thereby defining a buried channel layer between the drain/channel junction and the source/channel junction;

in each bitline row, forming multiple trench areas through said drain bitline, said channel layer and at least partially into said source groundline, thereby defining drain, source and channel regions adjacent each trench;

for each drain bitline, said bitline being formed wide enough to provide on at least one side of said trenches a drain contact area between bitline rows, such that a separate electrical contact to each drain region is made through such drain contact area;

for each trench, forming a gate insulator layer over the walls of such trench;

for each trench, forming a floating gate conductor disposed into the trench, insulated from the associated channel region by the gate insulator;

forming an interlevel insulator layer over said floating gate conductor; and forming onto the substrate multiple columns of program gate wordline conductors extending over respective columns of trenches, insulated from said floating gates by said interlevel insulator.

11. The method of fabricating a vertical memory cell array of claim 10, wherein each source groundline is formed to extend to the substrate surface, around the portion of the drain bitline forming the drain contact area, to provide a source contact area between bitline rows, such that a separate electrical contact to each source region is made through such source contact area.

* * * * *

UNITED STATES PATENT AND TRADEMARK OFFICE
CERTIFICATE OF CORRECTION

PATENT NO.   : 5,071,782
DATED        : December 10, 1991
INVENTOR(S)  : Kiyoshi Mori It is certified that error appears in the above-indentified patent and that said Letters Patent is hereby corrected as shown below:

The title page, should be deleted to be replaced with the attached title page.

The drawing sheets, consisting of Figs. 1a, 1b, and Fig. 3, should be deleted to be replaced with the drawing sheets, consisting of Figs. 1a, 1b, and Fig. 3, as shown on the attached pages.

Signed and Sealed this

Twenty-fourth Day of August, 1993

*Attest:*

BRUCE LEHMAN

*Attesting Officer*          *Commissioner of Patents and Trademarks*

United States Patent [19]

Mori

[11] Patent Number: 5,071,782
[45] Date of Patent: Dec. 10, 1991

[54] VERTICAL MEMORY CELL ARRAY AND METHOD OF FABRICATION

[75] Inventor: Kiyoshi Mori, Stafford

[73] Assignee: Texas Instruments Incorporated, Dallas, Tex.

[21] Appl. No.: 546,490

[22] Filed: Jun. 28, 1990

[51] Int. Cl.⁵ .......................................... H01L 21/265
[52] U.S. Cl. .................................. 437/48; 437/43; 437/52; 437/59; 437/203; 357/23.4; 357/23.5
[58] Field of Search .................. 437/48, 43, 52, 59, 437/203; 357/23.4, 23.5; 365/185

[56] References Cited

U.S. PATENT DOCUMENTS

| | | | |
|---|---|---|---|
| 3,975,221 | 8/1976 | Rodgers | 148/DIG. 53 |
| 4,169,291 | 9/1979 | Rossler | 357/23.5 |
| 4,222,062 | 9/1980 | Trotter et al. | 148/DIG. 168 |
| 4,975,383 | 12/1990 | Baglee | 437/52 |
| 4,987,090 | 1/1991 | Hsu | 437/52 |

FOREIGN PATENT DOCUMENTS 56-29362  3/1981  Japan ........................... 357/23.4

*Primary Examiner*—Brian E. Hearn
*Assistant Examiner*—Kevin Picardat
*Attorney, Agent, or Firm*—Ronald O. Neerings; N. Rhys Merrett; Melvin Sharp

[57] ABSTRACT

A vertical memory cell EPROM array (FIGS. 1, 1a and 1b) uses a vertical floating gate memory cell structure that can be fabricated with reduced cell area and channel length. The vertical memory cell memory array includes multiple rows of buried layers that are vertically stacked—a drain bitline (34) over a source groundline (32), defining a channel layer (36) in between. In each bitline row, trenches (22) of a selected configuration are formed, extending through the drain bitline and channel layer, and at least partially into the source groundline, thereby defining corresponding source (23), drain (24) and channel regions (25) adjacent each trench. The array can be made contactless (FIG. 1a), half-contact (FIG. 2a) or full contact (FIG. 2b), trading decreased access time for increased cell area.

11 Claims, 3 Drawing Sheets